(12) United States Patent
Galpin et al.

(10) Patent No.: US 10,293,463 B2
(45) Date of Patent: May 21, 2019

(54) CHEMICAL MECHANICAL PLANARIZATION PAD CONDITIONER WITH ELONGATED CUTTING EDGES

(71) Applicant: Entegris, Inc., Billerica, MA (US)

(72) Inventors: Andrew Galpin, Westford, MA (US); Daniel Wells, Lowell, MA (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 15/128,021

(22) PCT Filed: Mar. 20, 2015

(86) PCT No.: PCT/US2015/021679
§ 371 (c)(1),
(2) Date: Sep. 21, 2016

(87) PCT Pub. No.: WO2015/143278
PCT Pub. Date: Sep. 24, 2015

(65) Prior Publication Data
US 2017/0095903 A1    Apr. 6, 2017

Related U.S. Application Data

(60) Provisional application No. 61/968,846, filed on Mar. 21, 2014.

(51) Int. Cl.
*B24B 53/00* (2006.01)
*B24B 53/017* (2012.01)
(Continued)

(52) U.S. Cl.
CPC ............ *B24B 53/017* (2013.01); *B24B 37/20* (2013.01); *B24D 5/06* (2013.01); *B24B 53/12* (2013.01);
(Continued)

(58) Field of Classification Search
CPC ....... B24B 49/18; B24B 53/00; B24B 53/003; B24B 53/017; B24B 53/12; B24D 5/06
See application file for complete search history.

(56) References Cited

U.S. PATENT DOCUMENTS 5,527,424 A * 6/1996 Mullins ................ B24B 53/017
156/345.12
6,302,770 B1 * 10/2001 Aiyer ..................... B24B 37/32
451/287
(Continued)

FOREIGN PATENT DOCUMENTS

CN    1391506 A    1/2003
CN    1938128 A    3/2007
(Continued)

OTHER PUBLICATIONS

Written Opinion and International Search Report, PCT/US2015/021679, dated Jul. 8, 2015, 9 pages.
(Continued)

*Primary Examiner* — Timothy V Eley
(74) *Attorney, Agent, or Firm* — Entegris, Inc.

(57) ABSTRACT

A CMP pad conditioner for conditioning a polishing pad. Various embodiments of the disclosure include a plurality of elongated protrusions which work a conditioned surface of a polishing pad at a variety of attack angles as the CMP pad conditioner engages the polishing pad. Because of the elongated geometry of the protrusions, the variety of attack angles will tend to flex the conditioned face of the polishing pad in a multifaceted manner. Such multifaceted manipulation of the conditioned face enhances the cut rate of the conditioner assembly and the removal of debris in the pores of the polishing pad that are residual from the CMP process, to better open the pores of the polishing pad and to better maintain the removal rate in the CMP process.

18 Claims, 5 Drawing Sheets

(51) Int. Cl.
   *B24D 5/06* (2006.01)
   *B24B 37/20* (2012.01)
   *B24B 53/12* (2006.01)
   *H01L 21/306* (2006.01)

(52) U.S. Cl.
   CPC .... *B24D 2203/00* (2013.01); *H01L 21/30625* (2013.01)

(56) References Cited

U.S. PATENT DOCUMENTS

| | | | |
|---|---|---|---|
| 6,390,909 B2* | 5/2002 | Foster | B24B 37/08 |
| | | | 451/262 |
| 6,439,986 B1 | 8/2002 | Myoung et al. | |
| 7,300,338 B2 | 11/2007 | Wielonski et al. | |
| 7,799,375 B2 | 9/2010 | Rashed et al. | |
| 8,951,099 B2* | 2/2015 | Wu | B24B 53/007 |
| | | | 451/443 |
| 9,272,390 B2* | 3/2016 | Shen | B24D 7/02 |
| 2001/0041527 A1* | 11/2001 | Foster | B24B 37/08 |
| | | | 451/444 |
| 2004/0203325 A1* | 10/2004 | Donohue | B24B 53/017 |
| | | | 451/56 |
| 2006/0055864 A1 | 3/2006 | Matsumura et al. | |
| 2006/0079160 A1* | 4/2006 | Balagani | B24B 53/017 |
| | | | 451/285 |
| 2006/0130627 A1* | 6/2006 | Matsuki | B23C 5/02 |
| | | | 83/835 |
| 2007/0066194 A1 | 3/2007 | Wielonski et al. | |
| 2007/0077874 A1* | 4/2007 | Ataka | B24B 53/017 |
| | | | 451/443 |
| 2008/0153398 A1* | 6/2008 | Sung | B24B 53/017 |
| | | | 451/56 |
| 2008/0233842 A1* | 9/2008 | Saito | B24B 53/017 |
| | | | 451/56 |
| 2009/0123705 A1* | 5/2009 | Sung | B24B 53/017 |
| | | | 428/167 |
| 2011/0250826 A1* | 10/2011 | Yoon | B24B 53/017 |
| | | | 451/443 |
| 2012/0220205 A1* | 8/2012 | Wu | B24B 53/007 |
| | | | 451/443 |
| 2015/0087212 A1 | 3/2015 | Doering et al. | |
| 2017/0232576 A1* | 8/2017 | Sung | B24B 53/017 |
| | | | 451/56 |

FOREIGN PATENT DOCUMENTS

| | | |
|---|---|---|
| CN | 101972995 A | 2/2011 |
| CN | 103403844 A | 11/2013 |
| CN | 103534790 A | 1/2014 |
| JP | 2002337050 A | 11/2002 |
| JP | 2006026769 A | 2/2006 |
| JP | 2008055593 A | 3/2008 |
| JP | 2009241200 A | 10/2009 |
| WO | 2011/130300 A1 | 10/2011 |
| WO | 2012/122186 A2 | 9/2012 |
| WO | 2013166516 A1 | 11/2013 |

OTHER PUBLICATIONS

Rashed, A.H. "Properties and Characteristics of SiliconCarbide," Poco Graphite, Inc., (2002).

* cited by examiner

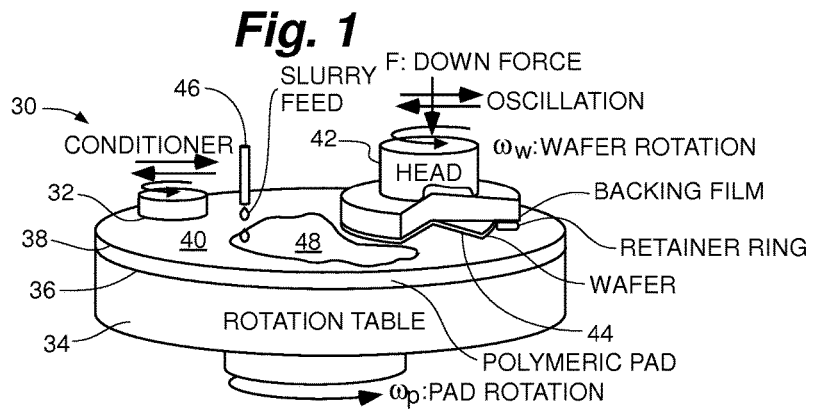
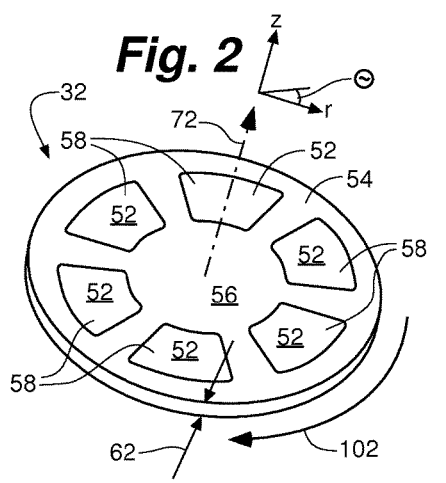
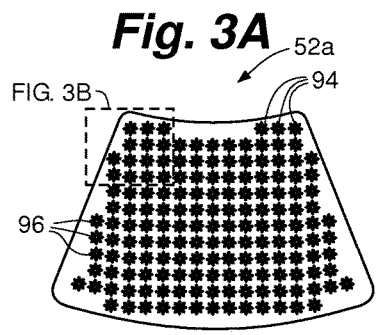
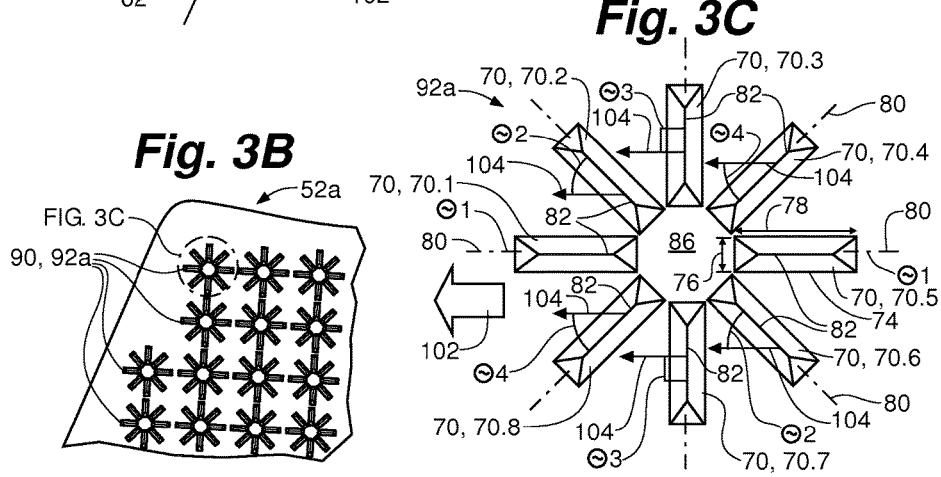

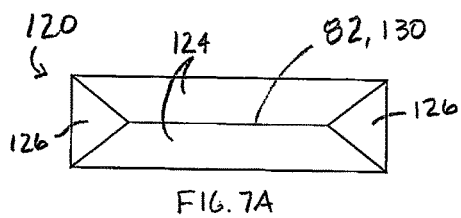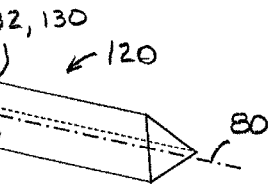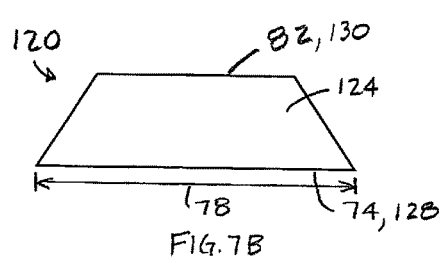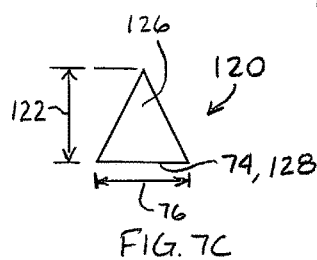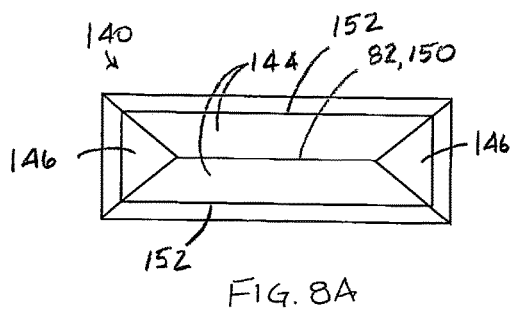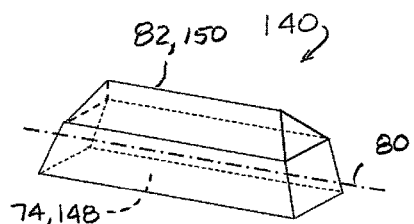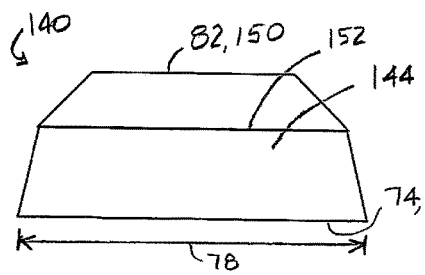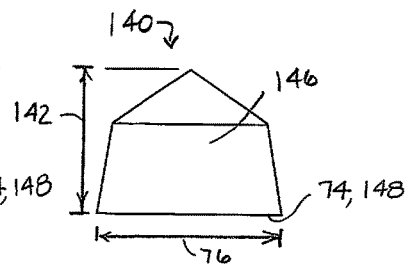

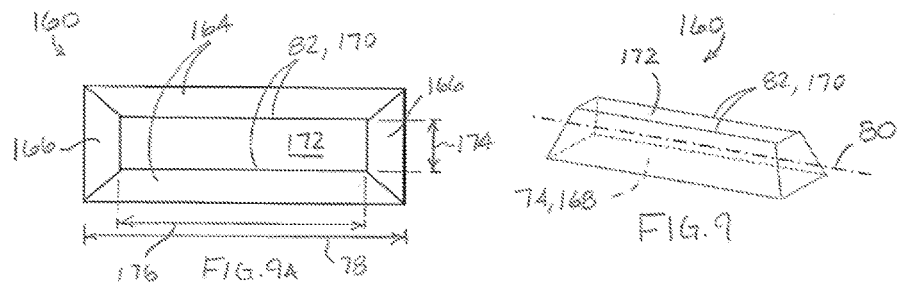
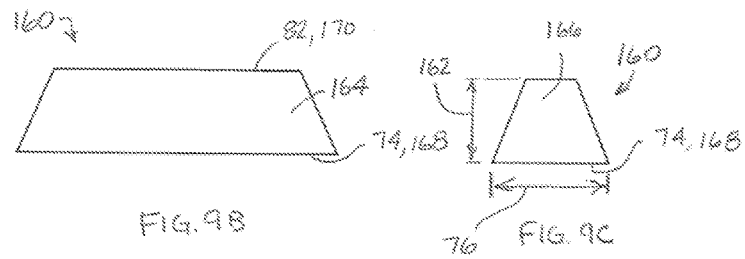
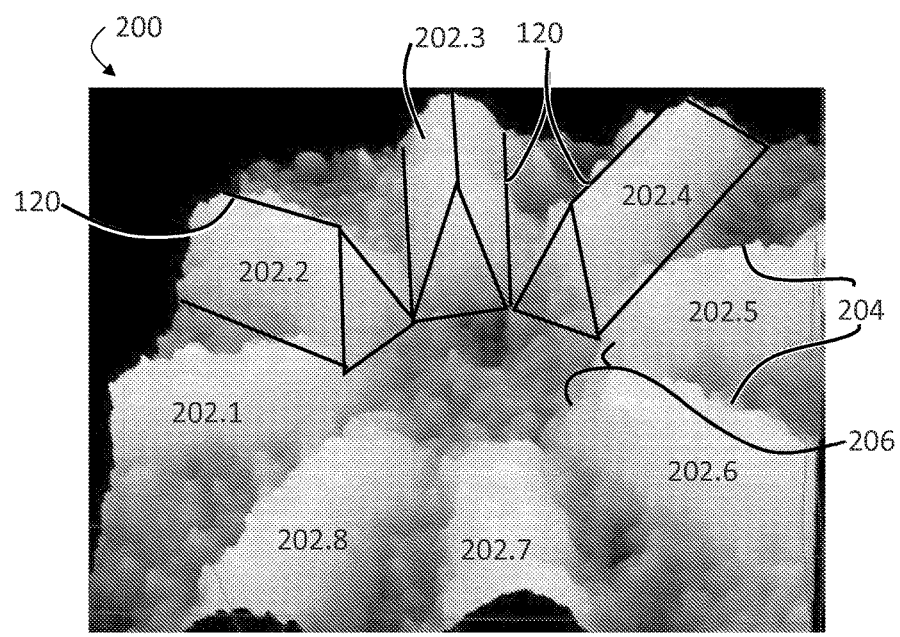
FIG. 10

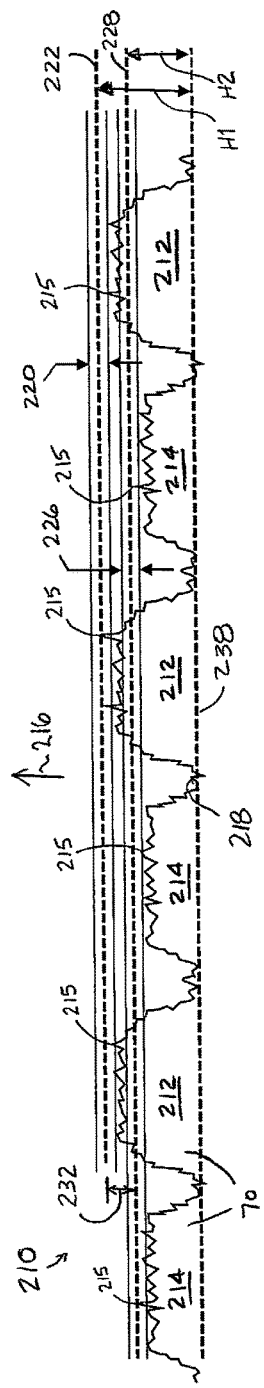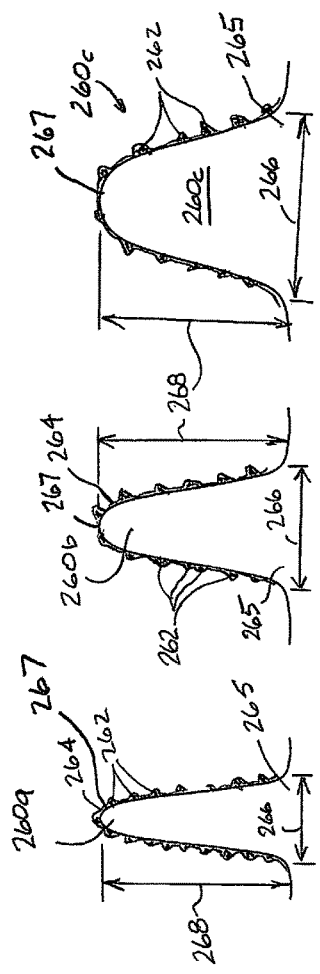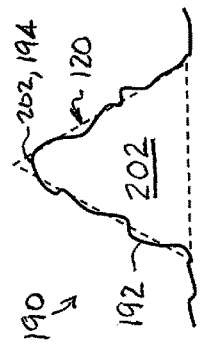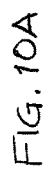
FIG. 11
FIG. 12A
FIG. 12B
FIG. 12C
FIG. 10A

CHEMICAL MECHANICAL PLANARIZATION PAD CONDITIONER WITH ELONGATED CUTTING EDGES

RELATED APPLICATIONS

This application is a U.S. National Stage application under 35 U.S.C. § 371 of International Patent Application PCT/US2015/021679, filed Mar. 20, 2015, which claims the benefit of and priority to U.S. Provisional Patent Application No. 61/968,846, filed on Mar. 21, 2014, the disclosures of which are hereby incorporated by reference herein in their entireties.

FIELD OF THE DISCLOSURE

The disclosure is directed generally to semiconductor manufacturing equipment. More specifically, the disclosure is directed to conditioning devices for the cleaning of polishing pads used in the manufacture of semiconductors.

BACKGROUND

Chemical mechanical planarization (CMP) is used extensively in the manufacture of semiconductors. During a CMP process, material is removed from a wafer substrate by the action of a polishing pad, a polishing slurry, and optionally chemical reagents. Over time, the polishing pad becomes matted and filled with debris from the CMP process. Periodically, the polishing pad is reconditioned using a pad conditioner that abrades the polishing pad surface and opens pores and creates asperities on the surfaces of the polishing pad. The function of the pad conditioner is to maintain the removal rate in the CMP process.

CMP represents a major production cost in the manufacture of semiconductor and memory devices. These CMP costs include those associated with polishing pads, polishing slurries, pad conditioning disks and a variety of CMP parts that become worn during the planarizing and polishing operations. Additional cost for the CMP process includes tool downtime in order to replace the polishing pad and the cost of the test wafers to recalibrate the CMP polishing pad.

A typical polishing pad comprises closed-cell polyurethane foam. During pad conditioning, the pads are subjected to mechanical abrasion in order to physically cut through the cellular layers of the pad surface. The exposed surface of the polishing pad contains open cells, which traps debris such as spent polishing slurry and material removed from the wafer during the CMP process. In each subsequent pad-conditioning step, the pad conditioner removes the outer layer of cells containing the embedded materials and minimizes removal of layers below the outer layer. Over-texturing of the polishing pad results in a shortened life, while under-texturing results in insufficient material removal rate and lack of wafer uniformity during the CMP step.

There is a continuing need for CMP pad conditioners with improved CMP pad texturing capabilities that enhances removal of debris for better controlled pad cut rate, without excessive removal of material from the polishing pad.

SUMMARY

Various embodiments of the disclosure include a plurality of elongated protrusions that define at least one ridge line for working a conditioned surface of a polishing pad at a variety of sweep angles as the CMP pad conditioner engages the polishing pad. Because of the elongated geometry of the protrusions, the variety of sweep angles are presented that tend to flex the conditioned face of the polishing pad in a multifaceted manner. We have found that such multifaceted manipulation of the conditioned face enhances the cut rate of the conditioner assembly and the removal of debris in the pores of the polishing pad that are residual from the CMP process, to better open the pores of the polishing pad and to better maintain the removal rate in the CMP process. It has been observed that the elongated protrusions as arranged and described have improved the cutting rate (e.g., μm/hr) of the CMP pad conditioner by as much as 25% over typical pyramid protrusions.

The elongated edge geometry attendant to the elongated protrusion can provide the additional benefit of a stronger protrusion than a pointed (e.g., "pyramid") protrusion. That is, by acting across an elongated edge, the stresses of operation are transferred over a larger shear area than with a pointed configuration, thereby enhancing the strength and leading to fewer failures that can litter the polishing pad with unwanted debris from the CMP pad conditioner.

In some embodiments, the elongated protrusions are formed from a porous substrate. The porosity provides inherent roughness as the pores are exposed in the forming process. The resultant roughness further enhances the cut rate of the CMP conditioning pad. In some embodiments, the resultant roughness can augment the implementation of superabrasive grit particles that can be bonded to the elongated protrusions by better capturing the grit on the roughened surface.

In some embodiments, the roughened elongated protrusions further provide inherent variations in the distribution of the height of the elongated protrusions. The variation in the heights can further enhance the working of the conditioned surface of the polishing pad, as the differing heights produce varying degrees of displacement of the conditioned surface of the polishing pad during conditioning. In some embodiments, the variation of protrusion heights is deliberately targeted at different predetermined levels. That is, the substrate is formed to have two or more different average heights.

Some embodiments implement a hard, durable coating over the elongated protrusions and/or substrate generally, improving the durability of the conditioning pad.

Some conventional CMP pad conditioners provide a roughened surface by utilizing abrasive grits, such as diamond particles, on the working face of the conditioner. The grit is typically set in an epoxy or a metal matrix material. Other CMP pad conditioners implement roughened protrusions that project normal to the face of the CMP pad conditioner, such disclosed in International Patent Application Publication No. WO 2012/122186 to Smith et al. Still other CMP pad conditioners utilize a combination of roughened protrusions and a superabrasive grit, such as disclosed in International Patent Application Publication No. WO 2013/166516 to Doering, et al. These conventional CMP pad conditioners also typically utilize a coating over the grit and/or protrusions, for example a CVD diamond coating.

An improved CMP pad cutting rate can be achieved by a chemical mechanical polishing pad conditioner that has a substrate including a front surface having a plurality of elongated protrusions integral (i.e., unitary) therewith. The plurality of elongated protrusions protrude in a frontal direction normal to the front surface, each of the plurality of elongated protrusions defining an elongated ridge line. In one embodiment, the plurality of elongated protrusions include a predetermined subset of the plurality of elongated protrusions within a variance of a registration plane, the registration plane being substantially parallel to the front surface, the elongated protrusions of the predetermined subset being located on the registration plane in a fixed and predetermined relationship relative to each other. In various embodiments, a coating of polycrystalline diamond covers at least the elongated ridge line of the predetermined subset. In some embodiments, the substrate has a porosity of at least 10%.

In various embodiments, a dispersion of superabrasive grit particles are disposed on the substrate and elongated protrusions. In one embodiment, a coating covers the substrate, the elongated protrusions, and the dispersion of superabrasive grit particles Another version of a CMP pad conditioner of the present disclosure includes a substrate that has a front surface having a plurality of elongated protrusions integral therewith extending from a substrate floor, the plurality of elongated protrusions protruding in a frontal direction that is normal to the front surface of the conditioner, the plurality of elongated protrusions being arranged in a repeating spacing pattern. In various embodiments, the elongated protrusions have an average height measured from the substrate floor level. In some embodiments, a dispersion of superabrasive grit particles can be disposed on the substrate including the plurality of elongated protrusions, and a coating that covers the substrate including the elongated protrusions and the dispersion of superabrasive grit particles. In various embodiments, the coatings are CVD diamond coatings.

Other substantially elongated protrusions may include pentagonal prism-like shapes, rectangular prism-like shapes, hexagonal prism-like shapes, and the like. In some embodiments, the prism-like shapes include an elongated distal edge that is furthest from the surface of the base or segment. This elongated distal edge extends from a first lateral end of the protrusion to a second lateral end of the protrusion. The prisms may include additional elongated edges, for example those that can be found in a pentagonal prism. In the case of a rounded prism cross section, the highest region between the two ends of the prism is considered the elongated distal edge.

Structurally, for various embodiments of the disclosure, a chemical mechanical planarization (CMP) conditioning segment comprises a substrate including a front surface and a plurality of elongated protrusions unitary therewith, each of the plurality elongated protrusions defining an elongate axis substantially parallel with the front face, each of the plurality elongated protrusions including at least one ridge line extending in a direction of the elongate axis, the plurality of elongated protrusions protruding in a frontal direction that is normal to the front surface. The elongate axis of each of the plurality of elongated protrusions defines one of at least two angles with respect a sweeping direction of the substrate. Optionally, the plurality of elongated protrusions are grouped in a plurality of clusters, each of the plurality of clusters including two or more of the plurality of elongated protrusions that define a predetermined pattern. In various embodiments, the at least one ridge line is rounded. For some embodiments, each of the plurality of clusters is located at a predetermined location. In one embodiment, each of the plurality of clusters defines a starburst pattern. Optionally, plurality of clusters are arranged in rows or in a matrixical arrangement.

In various embodiments, a ridge line of the at least one ridge line of at least some of the plurality of elongated protrusions is a superior ridge line to define a plurality of superior ridge lines. In some embodiments, a predetermined first subset of the superior ridge lines include distal extremities that are within a first variance of a first registration plane, and a predetermined second subset of the superior ridge lines include distal extremities that are within a second variance of a second registration plane. The first registration plane is offset from the second registration plane in a frontal direction. In various embodiments, a distance of the offset is less than at least one of the first variance and the second variance. In some embodiments, the at least one ridge line of at least some of the plurality of elongated protrusions includes two ridge lines that are coplanar. In one embodiment, an elongated mesa is defined between the two ridge lines that are coplanar. The substrate of the various embodiments can have a porosity in a range of 10% to 70% inclusive.

In various embodiments of the disclosure, a method of fabricating the CMP conditioning segments described above comprises: providing the substrate; and forming the plurality of elongated protrusions in accordance with an outline of a prism-like geometry. In one embodiment, the prism-like geometry is a triangular prism-like geometry. The substrate provided in the step of providing can comprise silicon carbide; optionally, the substrate provided in the step of providing comprises graphite, the method further comprising converting the graphite to silicon carbide after the step of machining. In various embodiments, the step of forming comprises one of wire electrical discharge machining, masked abrasion machining, water jet machining, photo abrasion machining, laser machining, and conventional milling.

BRIEF DESCRIPTION OF THE DRAWINGS

FIG. 1 is a perspective view of a wafer polishing apparatus with a conditioner in an embodiment of the disclosure;

FIG. 2 is a perspective view of pad conditioner having conditioning segments in an embodiment of the disclosure;

FIG. 3A is an image of a conditioning segment for mounting to a backing plate of FIG. 2;

FIG. 3B is a magnified, partial image of the image of FIG. 3A;

FIG. 3C is a plan view of a starburst protrusion cluster of FIGS. 3A and 3B;

FIG. 7 is an isometric view of a triangular prism-like protrusion in an embodiment of the disclosure;

FIGS. 7A through 7C are orthographic projection views of the triangular prism-like protrusion of FIG. 7;

FIG. 8 is an isometric view of a pentagonal prism-like protrusion in an embodiment of the disclosure;

FIGS. 8A through 8C are orthographic projection views of the pentagonal prism-like protrusion of FIG. 8;

FIG. 9 is an isometric view of a frustum prism-like protrusion in an embodiment of the disclosure;

FIGS. 9A through 9C are orthographic projection views of the frustum prism-like protrusion of FIG. 9;

FIG. 10 is a laser confocal microscope image of a starburst cluster of FIGS. 3A and 3B;

FIG. 10A is a hypothetical cross-section of an elongated protrusion of FIG. 10;

FIG. 11 is an enlarged, side-sectional view of resultant elongated protrusions of different heights interspersed in an embodiment of the disclosure; and FIGS. 12A through 12C are cross-sectional views of elongated protrusions utilizing superabrasive particles and having different aspect ratios in embodiments of the disclosure.

DETAILED DESCRIPTION

Figure 4A:
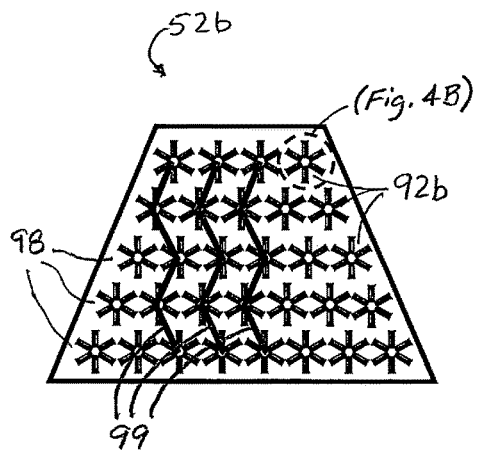
FIG. 4A is a plan view of a conditioning segment utilizing an alternative starburst protrusion cluster in an embodiment of the disclosure.

Referring to FIG. 1, a wafer polishing apparatus 30 with a pad conditioner assembly 32 in a chemical mechanical planarization (CMP) process is depicted in an embodiment of the disclosure. The depicted wafer polishing apparatus 30 includes a rotation table 34 having an upper face 36 with a polishing pad 38 (such as a polymeric pad) mounted thereon. The polishing pad 38 includes a working or conditioned face 40. A wafer head 42 having a wafer substrate 44 mounted thereon is arranged so that the wafer substrate 44 is in contact with the working face 40 of the polishing pad 38. In one embodiment, a slurry feed device 46 provides an abrasive slurry 48 to the polishing pad 38.

In operation, the rotation table 34 is rotated so that the polishing pad 38 is rotated beneath the wafer head 42, pad conditioner assembly 32 and slurry feed device 46. The wafer head 42 contacts the polishing pad 38 with a downward force F. The wafer head 42 can also be rotated and/or oscillated in a linear back-and-forth action to augment the polishing of the wafer substrate 44 mounted thereon. The pad conditioner assembly 32 is also in contact with the polishing pad 38. The pad conditioner assembly 32 is typically rotated, and can also be translated back and forth across the surface of the polishing pad 38.

Functionally, the polishing pad 38 removes material from the wafer substrate 44 in a controlled manner to give the wafer substrate 44 a polished finish. The function of the pad conditioner assembly 32 is to remove debris from the polishing operation that fills with debris from the CMP process and to open the pores of the polishing pad 38, thereby maintaining the removal rate in the CMP process.

Referring to FIG. 2, the pad conditioner assembly 32 is depicted in embodiment of the disclosure. The pad conditioner assembly 32 includes conditioning segments 52 affixed to a mounting face 54 of a substrate or backing plate 56, the mounting face 54 being adjacent the polishing pad 38 during the operation of FIG. 1. In one embodiment, the segments 52 are bonded to the mounting face 54 using an adhesive such as an epoxy. Each conditioning segment 52 includes a contact face 58 that contacts the polishing pad 38 during the operation of FIG. 1. In various embodiments, a thickness 62 of the backing plate 56 is in the range of 0.05 to 0.5 inches inclusive; in some embodiments, the thickness 62 is within a range of 0.05 to 0.15 inches inclusive. (Herein, a range that is indicated as being "inclusive" includes the end point values of the stated range.)

Referring to FIGS. 3A through 3C, a conditioning segment 52a is presented in an embodiment of the disclosure. The conditioning segment 52a is includes a plurality of elongated protrusions 70 that protrude in a forward direction 72 (FIG. 2) that is normal to the contact face 58 of the conditioning segment 52a, the elongated protrusions 70 being unitary with the conditioning segment 52a. Each elongated protrusion 70 includes a base 74 that defines a width 76 and a length 78, the length 78 being greater than the width 76 and defining an elongate axis 80 of the elongated protrusion 70 (FIG. 3C). Each elongated protrusion 70 further defines at least one ridge line 82 that is elongated and in substantial alignment with the length 78. Accordingly, each ridge line 82 is elongate in the direction of the elongate axis 80. In various embodiments, a ratio of the base length 78 to the base width 76 is in the range of 2 to 20 inclusive. In some embodiments, the ratio is in the range of 2 to 10 inclusive. In some embodiments, the ratio is in the range of 2 to 5 inclusive. A non-limiting example of the dimensions of the base width 76 and the base length 78 is 150 µm and 500 µm, respectively.

In the depicted embodiments, the plurality of elongated protrusions 70 are grouped into a plurality of protrusion clusters 90, the protrusion clusters defining a predetermined pattern. For the conditioning segment 52a, the elongated protrusions 70 of each protrusion cluster 90 are arranged in a "starburst" cluster 92a, wherein the elongate axes 80 of the elongated protrusions 70 extend radially outward from a central region 86. For the depiction of FIG. 3C, the starburst cluster 92a includes eight elongated protrusions 70 rotationally distributed uniformly about the central region 86, each elongated protrusion 70 being identified with a numeric decimal point suffix 70.1 through 70.8. In various embodiments, the starburst clusters 92a are arranged in a matrixical arrangement of columns 94 and rows 96, as depicted in FIG. 3A.

Figure 4B:
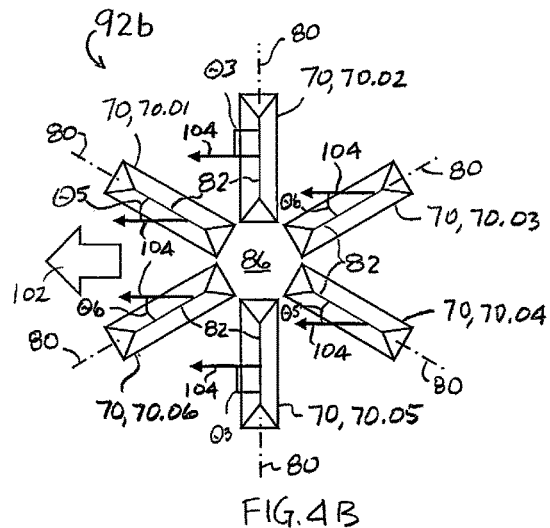
FIG. 4B is a plan view of a starburst protrusion cluster of FIG. 4A.

Referring to FIGS. 4A and 4B, a conditioning segment 52b that includes a plurality of starburst clusters 92b is depicted in an alternative arrangement in an embodiment of the disclosure. The starburst cluster 92b includes six elongated protrusions 70 (rather than the eight presented for the starburst cluster 92a), the elongated protrusions 70 being rotationally distributed uniformly about the central region 86. For the starburst cluster 92b, each elongated protrusion 70b is identified with a numeric decimal point suffix 70.01 through 70.06. In various embodiments, the starburst clusters 92b are arranged in a staggered arrangement that presents a plurality of rows 98 that are shifted with respect to each other to define a zigzag patterns 99 substantially perpendicular to the rows 98, as depicted in FIG. 4A. A staggered arrangement is also contemplated wherein a plurality of columns are shifted with respect to each other to define zigzag patterns orthogonal to the columns (not depicted).

It is noted that the columns 96 and rows 98 are depicted herein as being substantially straight and orthogonal to each other. Other arrangements are contemplated, such as rows that follow an arcuate line, e.g. at know radii from the center of the backing plate 56. Furthermore, in the depicted embodiments, the "columns" 96 are depicted as being substantially aligned with the radial direction of the conditioning segment 52 as mounted to the backing plate 56. Such an arrangement is non-limiting. That is, the columns 96 and rows 98 can be arranged diagonally at selected angles with respect to the radial direction.

It is understood that the sweep angles θ of the starburst clusters 92a, 92b can be altered in a variety of ways, for example by changing the angular orientation of the starburst cluster 92a or 92b, reducing or increasing the number of elongated protrusions 70 that are uniformly distributed about the central region 86, distributing the elongated protrusions 70 about the central region 86 in a non-uniform distribution, or combinations thereof.

In operation, the pad conditioner assembly 32 is rotated, for example, in a rotational direction 102 (FIGS. 2, 3C, and 4B). Each starburst cluster 92a, 92b follows the rotational direction 102 such that each elongated protrusion 70 defines an sweep angle θ, taken as the angle between the ridge line 82 of the respective elongated protrusion 70 and a sweeping direction of travel 104. Because of the starburst arrangement, a variety of sweep angles θ are presented. Consider, for example, starburst cluster 92a, presenting sweep angles θ1 (0°), θ2 (+45°), θ3 (90°), and θ4 (−45°). Consider also starburst cluster 92b, presenting sweep angles θ5 (+30°), θ6 (−30°), and θ3 (90°).

Figure 5:
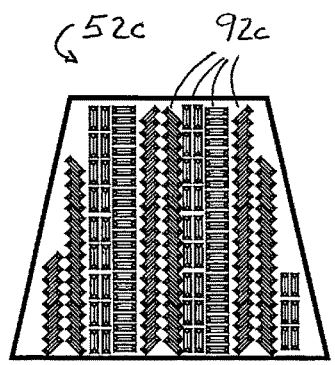
FIG. 5 is a plan view of a conditioning segment utilizing columnar protrusion clusters in an embodiment of the disclosure.

Protrusion clusters 90 other than starburst protrusion clusters 92a, 92b are also contemplated. For example, referring to FIG. 5, a conditioning segment 52c that includes a plurality of columnar clusters 92c is depicted in an embodiment of the disclosure. The columnar clusters 92c depicted present the same variety of sweep angles θ1 through θ4 as the starburst clusters 92a, but with elongated protrusions 70 that are arranged in columnar form. The columnar clusters 92c can also be configured to present sweep angles θ5 and θ6 of the starburst cluster 92b, either alternatively or in addition. While the columnar clusters 92c are depicted as being a columnar orientation, embodiments where the columnar clusters are arranged in rows or in a mix of columnar and row orientations is also contemplated.

Figure 6:
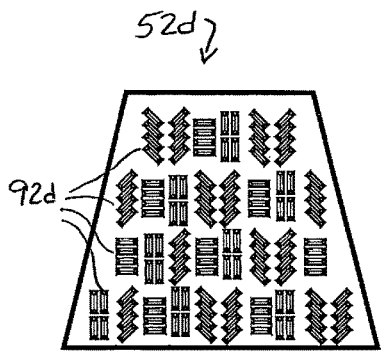
FIG. 6 is a plan view of a conditioning segment utilizing linear protrusion clusters in an embodiment of the disclosure.

Referring to FIG. 6, a conditioning segment 52d that includes a plurality of linear clusters 92d is depicted in an embodiment of the disclosure. Each linear cluster 92d includes a plurality of elongated protrusions 70 that are in the same angular orientation. In the depicted embodiment, the linear clusters 92d are in a columnar arrangement, with a given column including a mix of linear clusters 92d, and present the same variety of sweep angles θ1 through θ4 as the starburst clusters 92a. The linear clusters 92d can also be configured to present sweep angles θ5 and θ6 of the starburst cluster 92b, either alternatively or in addition. While the linear clusters 92d are depicted as being linear in a columnar orientation, embodiments where the linear clusters are linear in row orientation or in a mix of columnar and row orientations is also contemplated.

It is contemplated that a mix of conditioning segments 52, be utilized on the same conditioner assembly 32. For example, one non-limiting embodiment includes a mix of alternating conditioning segments of 52a and 52b. Such an arrangement would present a larger variety of sweep angles θ than any one conditioning segment 52a or 52b alone. Another embodiment includes a mix of alternating conditioning segments 52c and 52d. Various embodiments include a mix of all four conditioning segments 52a through 52d, while other embodiments include a mix of any two or three of the conditioning segments 52a through 52d.

It is further contemplated that a variety of types of protrusion clusters 90 be included on the same conditioning segment 52. For example, in one embodiment, a mix of the starburst clusters 92a and 92b are included on the same conditioning segment 52. Another embodiment includes a mix of columnar and linear. As with the alternating conditioning segments 52a and 52b, such an arrangement would present a larger variety of sweep angles θ than any one conditioning segment 52a-52d alone. Various embodiments include a mix of protrusion clusters 90, such as all four protrusion clusters 92a through 92d. Other embodiments include a mix of only two or three of the protrusion clusters 92a through 92d. It is further contemplated that single peak protrusions (not depicted) be interspersed among the elongated protrusions 70 of the present disclosure.

Functionally, for the embodiments discussed above, including conditioning segments 52a through 52d and the variants described, the variety of sweep angles θ in combination with the ridge lines 82 of the elongated protrusions 70 provide a multifaceted manipulation of the conditioned face 40 of the polishing pad 38. For example, for the starburst clusters 92a of conditioning segment 52a, the ridge lines 82 that work the surface of polishing pad 38 at a given sweep angle θ (e.g., sweep angle θ2 of elongated protrusions 70.2 and 70.6 of FIG. 3C) will tend to flex the conditioned face 40 of the polishing pad 38 in a different manner than the ridge lines 82 that sweep at different angles (e.g., than for sweep angles θ1, θ3, and θ4). As all points on the conditioned face 40 will generally be abraded by multiple starburst clusters 92a as the conditioner assembly 32 is rotated and/or translated over the conditioned face 40 of the polishing pad 38, each of these points will also tend to be abraded by multiple ridge lines 82 at the different sweep angles θ1 through θ4. (The artisan will recognize that the same is true of the conditioning segments 52b, 52c, and 52d, and the variants described above.) This is in contrast to conventional CMP pad conditioners that tend to generate only point abrasions that do not have the directional abrasion characteristics of the ridge lines 82.

We have found that such multifaceted manipulation of the conditioned face 40 enhances the cut rate of the conditioner assembly 32 and the removal of debris in the pores of the polishing pad 38 that are residual from the CMP process, to better open the pores of the polishing pad 38 and to better maintain the removal rate in the CMP process. Increases in the cut rate as high as 25% over conventional conditioning pads having pyramidal protrusions have been observed.

Referring to FIGS. 7 and 7A-7C, a triangular prism-like geometry 120 for the elongated protrusion 70 is depicted in an embodiment of the disclosure. The triangular prism-like geometry 120 is so-named because an end view or cross-sectional view defines a triangle. The triangular prism-like geometry 120 includes the aforementioned base 74 having width 76 and length 78, the ridge line 82, and defining the elongate axis 80. The triangular prism-like geometry 120 also defines a height 122 and further presents side faces 124 and end faces 126. It is understood that the base 74 does not define a face, but rather an imaginary boundary 128, across which the triangular prism-like geometry 120 is unitary with the conditioning segment 52. The ridge line 82 of the triangular prism-like geometry 120 is a "superior" ridge line 130, meaning that the ridge line 130 defines a single, distal or uppermost edge, as opposed to co-planar uppermost edges.

Referring to FIGS. 8 and 8A-8C, a pentagonal prism-like geometry 140 for the elongated protrusion 70 is depicted in an embodiment of the disclosure. The pentagonal prism-like geometry 140 is so-named because an end view or cross-sectional view defines a pentagon. The pentagonal prism-like geometry 140 includes the aforementioned base 74 having width 76 and length 78, ridge lines 82, and defining the elongate axis 80. The pentagonal prism-like geometry 140 also defines a height 142 and further presents side faces 144 and end faces 146. It is understood that the base 74 does not define a face, but rather an imaginary boundary 148, across which the pentagonal prism-like geometry 140 is unitary with the conditioning segment 52. The ridge lines 82 of the pentagonal prism-like geometry 140 includes a superior ridge line 150 and two "inferior" ridge lines 152, meaning that the ridge lines 152 are below the superior ridge line 150 (i.e., closer to the mounting face 54 of the backing plate 56 than the superior ridge line 150).

Referring to FIGS. 9 and 9A-9C, a frustum prism-like geometry 160 for the elongated protrusion 70 is depicted in an embodiment of the disclosure. The frustum prism-like geometry 160 is so-named because an end view or cross-sectional view defines a frustum. The frustum prism-like geometry 160 includes the aforementioned base 74 having width 76 and length 78, ridge lines 82, and defining the elongate axis 80. The frustum prism-like geometry 160 also defines a height 162 and further presents side faces 164 and end faces 166. It is understood that the base 74 does not define a face, but rather an imaginary boundary 168, across which the frustum prism-like geometry 160 is unitary with the conditioning segment 52. The ridge lines 82 of the frustum prism-like geometry 160 do not include a superior ridge line, but rather two co-planar ridge lines 170 that are uppermost, between which an elongated mesa 172 is defined. That is, the ridge lines 170 are at substantially the same distance from a nominal floor datum plane 238 (FIG. 11).

The elongated mesa 172 is elongated in in the direction of the elongate axis 80, and defines a mesa width 174 and a mesa length 176, the mesa length 176 being greater than the mesa width 174. In various embodiments, a ratio of the mesa length 176 to the mesa width 174 is in the range of 2 to 20 inclusive. In some embodiments, the ratio is in the range of 2 to 10 inclusive. In some embodiments, the ratio is in the range of 2 to 5 inclusive.

The prism-like geometries 120, 140, and 160 are provided as non-limiting examples. Other cross sections for prism-like geometries are contemplated, for example square, hexagonal, and semi-circular. For geometries that do not inherently define a corner edge that can be identified as a ridge line (e.g., a semicircle), the ridge line passes through the distal extremity points of the cross-sections of the geometry, the cross-sections being normal to the elongate axis 80.

In one embodiment, the elongated protrusions are of substantially uniform height. Alternatively, the one or more conditioning segments 52 can include a combination of protrusions of different nominal height in each conditioning segment 52. The conditioning segments 52 can also each have substantially uniform protrusion profiles on a given segment, but that differ between segments. In another embodiment, the conditioning segments 52 can have different combinations of varying elongated protrusion profiles.

The various pad conditioners, pad conditioner assemblies and conditioning segments depicted herein are not limited in their size or area, but can for example be made in a standard 4¼ inch diameter disc configuration. In some embodiments, the backing plate 54 is joined to the conditioning apparatus, with the backing plate 54 being in the form of a disk ranging in diameter from about 2 to 5 inches. Of course, other shapes and sizes can be utilized as the backing plate 54 for pad conditioners or conditioning segments.

In various embodiments, the conditioning segments 52 are of a ceramic material, such as silicon, silicon carbide, and silicon nitride. The ceramic material can, for example, be a beta silicon carbide or a ceramic material comprising beta silicon carbide, which can include a separate carbon phase or excess carbon.

In some embodiments, a method of making the pad conditioner from a near net shape porous graphite precursor is implemented that is textured with the elongated protrusions 70/protrusion clusters 90 using one of several forming processes. The textured graphite substrate can then be converted to near net shape silicon carbide material substrate using conversion techniques known in the art. The near net shaped silicon carbide can be a beta silicon carbide. Herein, "near-net shape" is used to indicate a component that involves minimal post-process machining to achieve final form and tolerances. Forming the conditioning segment 52 by converting a near net shaped porous graphite precursor to a near net shaped silicon carbide material can provide cost advantages over texturing silicon carbide directly, because forming silicon carbide is a time-consuming process due to its hardness.

In other embodiments, a hardened substrate such as silicon carbide is directly textured, i.e., without texturing and converting graphite. Direct texturing can provide better resolution of the elongated protrusions 70.

In some embodiments, the processed or textured conditioning segments 52 are of a low porosity (i.e., high density) ceramic, such as a high density silicon carbide. In some embodiments, the silicon carbide is a reaction-bonded silicon carbide material where a reaction-bonded silicon carbide is sintered alpha silicon carbide powder body with silicon infiltrated into the pore structure. This process tends to reduce the porosity of the final processed conditioning segments 52, particularly at the surfaces of the textured conditioning segments 52.

In other embodiments, the porosity of the conditioning segments 52 is substantial. For various embodiments, the porosity of the ceramic conditioning elements 52 is in the range of 10% to 70% inclusive; in some embodiments, the porosity is in the range of 0.2% to 30% inclusive; in some embodiments, the porosity is in the range of 2% to 20% inclusive.

Near net shaped graphite that is converted to near net shaped silicon carbide can be made by the methods and materials disclosed in "Properties and Characteristics of Silicon Carbide", Edited by A. H. Rashed, 2002, Poco Graphite Inc. Decatur, Tex. ("Poco reference"), available on the world wide web at URL: www.poco.com/AdditionalInformation/Literature/ProductLiterature/SiliconCarbide/tabid/194/Default.aspx (last visited Mar. 18, 2015), the contents of which are incorporated herein by reference in their entirety except for express definitions contained therein. The Poco reference discloses the properties of SUPERSIC-1, a SiC material, as typically having an average open porosity of 19% and an average closed porosity of 2.5% for a total porosity of 20.5% (Poco reference, p. 7). SUPERSIC-1 can also be used as a precursor for the substrate. For example protrusions can be formed in a SUPERSIC-1 substrate by a photo-abrasion process to form the near net shaped substrate. The silicon carbide can also comprise SUPERSIC or SUPERSIC-3C, also available from Poco Graphite, Decatur, Tex. The graphite for near net shaped substrates that can be converted to near net shaped silicon carbide can also be obtained from Poco Graphite.

Silicon carbide, as well as near net shaped graphite and silicon carbide precursors, used in various embodiments include porous and dense silicon carbides that are made in part or in whole by the methods and materials disclosed in U.S. Pat. No. 7,799,375 Rashed, et al., the contents of which are incorporated herein by reference in their entirety except for express definitions contained therein. Rashed discloses that "a porous silicon carbide preform having an open porosity is provided. The open porosity is preferably in a range of about 10% to about 60%" (Rashed, col. 5, lines 44-46), with specific examples of open porosities of 18-19%, 0.3%, 0.2% and 2.3% tabulated in Table 1 (Rashed, col. 7, lines 36-50). In one example, a porous graphite substrate from Poco Graphite can be heated at 1800° C. in the presence of silicon monoxide gas to convert the porous graphite to porous silicon carbide substrate. Accordingly, in some embodiments, a near net shaped porous graphite substrate with protrusions can be heated at 1800° C. in the presence of silicon monoxide gas to convert the near net shaped porous graphite to a near net shaped porous silicon carbide.

Several manufacturing methods are available to the artisan for forming the elongated protrusions 70 on the conditioning substrates or segments 52. Non-limiting examples of methods of forming the elongated protrusions 70 on the surface of a graphite or silicon carbide substrate include wire electrical discharge machining (EDM), masked abrasion machining, water jet machining, photo abrasion machining, laser machining, and conventional milling. Example machining techniques are disclosed in U.S. Patent Application Publication No. 2006/0055864 to Matsumura, et al., as well as PCT Publication No. WO/2011/130300 to Menor, et al., the disclosures of which are incorporated by reference in their entirety herein except for express definitions contained therein.

In various embodiments, the pore sizes of the porous materials are in the range of 2 to 60 μm inclusive; in some embodiments, the pore sizes are in the range of 20 to 50 μm inclusive; in some embodiments, the pore sizes are in the range of 5 to 50 μm inclusive; in some embodiments, the pore sizes are in the range of 5 to 30 μm inclusive.

Referring to FIG. 10, a laser confocal microscope image 200 (hereinafter "micrograph" 200) of resultant prism-like protrusions 202 produced by machining a porous substrate is depicted in an embodiment of the disclosure. The micrograph 200 depicts the starburst cluster 92a such as found in FIGS. 3A and 3B. The elongated protrusions 70 of the micrograph are identified individually by numerical references 202.1 through 202.8, following the suffix convention of FIG. 3C. Resultant ridge lines 204 and resultant edges 206 are also depicted in the micrograph 200. Note that the resultant edges 206 and corners of the resultant prism-like protrusions 202 appear radiused or rounded, as opposed to a sharp and well-defined.

The porosity as well as the pore sizes of the conditioning segments 52 is a factor in the definition of the resultant prism-like protrusions 202. For example, texturing the conditioning segment 52 to provide given prism-like geometries will tend to expose the voids of the pores, so that the side faces 124, 144, 164, and end faces 126, 146, 166 of the prism-like geometries 120, 140, 160 will take on a pocked or roughened texture. The exposed pores can also cause irregularities and jaggedness in the ridge lines 82, as well as other corners and edges of the prism-like geometries 120, 140, 160, as best seen elongated protrusions 202.5 and 202.6 of the micrograph 200. FIG. 10 also qualitatively illustrates the departure from an ideal, triangular prism-like geometry 120 by outlining the triangular prism-type geometries 120 onto the resultant elongated protrusions 202.2, 202.3, and 202.4 on the micrograph 200.

Accordingly, the so-called "prism-like" geometries 120, 140, and 160 describe ideal or aspirational geometries that serve more as a desired outline for the resultant shape, rather than a detailed description of an actual resultant shape, as illustrated in FIG. 10. The depiction of FIG. 10 illustrates qualitatively the resultant exposed edges and corners of a resultant triangular prism-like geometry 200a, with the ideal or aspirational triangular prism-like geometry 120 serving as an outline. The greater the porosity and pore sizes, the greater the deviation of the actual or resultant geometries deviate from the ideal. Generally, the machining technique can also contribute to the deviations from the ideal geometries, with certain techniques further contributing to the roughness more so than other techniques; however, as porosity and pore sizes increase, the resultant deviation from the ideal prism-like geometry becomes increasingly independent of the formation or machining technique.

Herein, forming a shape "in accordance with an outline" means to perform the forming operation as one would with a stable, non-porous material (such as a metal) to attain the outlined shape. To form "in accordance with an outline" does not mean that the final formed shape necessarily meets the specifications of the outline; rather, the resulting shape includes the unpredictable vagaries and departures from the outline associated with the porosity of the substrate material. Thus, the resultant prism-like protrusions 202 of FIG. 10, while not defining exactly the outline of the ideal triangular prism-like geometry 120 to which they aspire, are the result of forming the resultant prism-like protrusions 202 "in accordance with an outline" of the triangular prism-like geometry 120.

The pocked texture provided by the porous substrate is generally advantageous for the conditioning of polishing pads. In various embodiments, the effect of the pocked texture produces a roughness akin to superabrasive grits, particularly for substrates with higher porosities and larger pore sizes. In some embodiments, machined porous materials, after application of a coating, produce a root-mean-square roughnesses in the range of 0.5 μm to 10 μm inclusive when no sampling length is considered and in the range of 0.05 μm to 1.0 μm inclusive when an 8 μm sampling length is considered. Herein, a "sampling length" is the length over which roughness data is accumulated.

Referring to FIG. 10A, a hypothetical cross-sectional view 190 of a resultant prism-like protrusions 202 is presented in an embodiment of the disclosure. The cross-sectional view 190 also includes the outline of the triangular prism-like geometry 120, depicted in dashed lines, which constitutes the ideal or aspirational profile of the prism-like protrusions 202 of the micrograph 200. In some embodiments, the irregularities caused by the porosity of the conditioning segment 52, as well as the vagaries of machining processes, creates an irregular profile 192. The irregular profile 192 is characterized by the jaggedness described above. In addition, in the depicted embodiments, the irregularities cause the resultant ridge line 202 to define a rounded profile 194.

It is further noted that rounded ridge lines can be a deliberate product of the machining process, such as illustrated in FIGS. 12A through 12C below.

Referring to FIG. 11, the effect the jaggedness on the resultant ridge lines 202 on the variance of the heights of the elongated protrusions 70 is depicted in an embodiment of the disclosure. A substrate 210 having first and second predetermined subsets of elongated protrusions 212 and 214 integral therewith and extending in a frontal direction 216 is depicted in an embodiment of the disclosure. A "predetermined subset of elongated protrusions" is a subset of elongated protrusions that are identified by location, for example by coordinate positions on the contact face 58 of the conditioning segment 52, or by a relative position within a protrusion cluster 90.

The first predetermined subset of elongated protrusions 212 are side-sectional views of the resultant pentagonal prism-like geometries, such as outlined at FIG. 8; the second predetermined subset of elongated protrusions 214 are side-sectional views of resultant triangular prism-like geometries, such as outlined at FIG. 7 and depicted at FIG. 10. In this embodiment, the first predetermined subset of the protrusions 212 are nominally at one average height H1 and the second predetermined subset of protrusions 214 are nominally at a second average height H2, the average height H1 being greater than the average height H2. The "frontal direction" 216 is a direction substantially normal to and extending away from a front surface or "floor" 218 of the substrate 210. The first predetermined subset of protrusions 212, being of nominally greater height, are alternatively referred to herein as "major protrusions." The second predetermined subset of protrusions 214, being of nominally lesser height, are alternatively referred to as "minor protrusions."

Each of the protrusions of the first and second predetermined subsets 212 and 214 can be characterized as having a distal extremity 215. The first predetermined subset of protrusions 212 can have distal extremities 215 that are within a first variance 220 of a first registration plane 222, the first registration plane 222 being substantially parallel to the front surface 218. Herein, a "variance" is defined as a height difference between the highest and the lowest distal extremity of a predetermined subset of protrusions, the height being defined as normal to a registration plane. In one embodiment, the first predetermined subset of protrusions 212 are located proximate the first registration plane 222 in a fixed and predetermined relationship relative to each other.

The second predetermined subset of protrusions 214 includes distal extremities 215 that are within a second variance 226 of a second registration plane 228, the second registration plane 228 being substantially parallel to the front surface 218, the second predetermined subset of protrusions 214 being located on the second registration plane 228 in a fixed and predetermined relationship relative to each other.

The first and second registration planes 222 and 228 are also referred to, respectively, as the "upper" and "lower" registration planes, "upper" meaning that it is furthest from the floor 218 of the substrate 210. It is noted that the first predetermined subset of protrusions 212 extend through the second ("lower") registration plane 228.

The first registration plane 222 can be characterized as being nominally offset from the second registration plane 228 in the frontal direction 216 by an offset distance 232. In certain embodiments, the offset distance 232 is greater than either the first variance 220 or the second variance 226, as depicted in FIG. 12. The offset distance 232 can be characterized as being greater than a multiple or factor of either variance 220 or 226, or as a fixed dimension or range of dimensions. A typical and non-limiting range of dimensions for the variances 220, 226 is 5 µm to 50 µm. In some embodiments, the variances 220, 226 can range from 10 µm to 25 µm. The variances 220, 226 can also be characterized as being greater than a minimum value and less than a maximum value. Typical and non-limiting multiples or factors of the variances 220, 226 for the offset distance 232 is greater than 1 or 2. Typical and non-limiting values for the offset distance 232 are in the range from 10 µm to 80 µm inclusive.

In other embodiments, the offset distance 232 less than one or both of the first variance 220 and the second variance 226 (not depicted). That is, in the example of FIG. 12, some of the protrusions of the first predetermined subset of protrusions 212 can conceivably have distal extremities 215 that are less than the second average height H2 of the second predetermined subset of protrusions 214, even though they belong to the first predetermined subset of protrusions 212 that has a greater average height H1. Similarly, some of the protrusions of the second predetermined subset of protrusions 214 can conceivably have distal extremities 215 that are greater than the first average height H1 of the first predetermined subset of protrusions 212, even though they belong to the second predetermined subset of protrusions 214 that has a lesser average height H1.

In one embodiment, the first and second average heights H1 and H2 of the respective first and second predetermined subsets of protrusions 212 and 214 are average "peak-to-valley" heights. A peak-to-valley height of a protrusion is defined as the average distance between the distal extremity 215 and a nominal floor datum plane 238. The nominal floor datum plane 238 is a plane that passes through the median level of the floor 218. The porosity of the conditioning segment 52 can result in surfaces that are unevenly machined, such that the floor 218 can possess a high degree of roughness and randomness, making the median level difficult to determine. Accordingly, one way of characterizing the average peak-to-valley height of the protrusions is to establish a minimum average peak-to-valley height for the major protrusions and a maximum average peak-to-valley height for the minor protrusions. Such characterization can allow for a high level of uncertainty in terms of the location of the floor datum plane 238. Another method of characterization is to determine a "prominence height" of each protrusion, such as disclosed at International Patent Application Publication No. WO 2012/122186 to Smith et al.

Referring to FIGS. 12A through 12C, cross-sectional views of various elongated protrusions 260a, 260b, and 260c, respectively, that utilize superabrasive grit particles 262 are depicted in embodiments of the disclosure. (The elongated protrusions 260a, 260b, and 260c are herein referred to collectively or generically as elongated protrusions 260.) In one embodiment, the superabrasive grit particles 262 comprise diamond particles. The superabrasive grit particles can be secured to the elongated protrusions 260 utilizing a bonding agent such as epoxy. In various embodiments, the elongated protrusions 260 are fabricated from a porous substrate, such as described for the conditioning segments 52 above. Also, in some embodiments, the superabrasive grit particles 262 are coated with a hard and durable coating 264, such as CVD diamond.

The cross sections of the elongated protrusions 260 each include a base 265 defining a base width 266 and a radiused or rounded or radiused ridge line 267, with a height 268 being defined between the base 265 and the radiused ridge line 267. Each of the elongated protrusions 260a, 260b, and 260c are characterized as having a unique "aspect ratio," defined as the ratio of the height 268 to the base width 266. In various embodiments, the aspect ratio of a given elongated protrusion is in the range of 0.5 to 5 inclusive; in some embodiments, in the range of 0.5 to 3 inclusive; in some embodiments, in the range of 1 to 3 inclusive.

Functionally, the resultant roughened surface is conducive to harboring the superabrasive grit particles 262, making the bonding agent more effectual. The superabrasive grit particles 262. The aspect ratio qualitatively affects the cut rate of the elongated protrusion 260. Sharper protrusion profiles (i.e., elongated protrusion cross-sections with a higher aspect ratio) tend to produce more aggressive cut rates that more rounded protrusion profiles (i.e., elongated protrusion cross-sections with a lower aspect ratio).

Each of the additional figures and methods disclosed herein can be used separately, or in conjunction with other features and methods, to provide improved devices and methods for making and using the same. Therefore, combinations of features and methods disclosed herein may not be necessary to practice the disclosure in its broadest sense and are instead disclosed merely to particularly describe representative and preferred embodiments.

Various modifications to the embodiments may be apparent to one of skill in the art upon reading this disclosure. For example, persons of ordinary skill in the relevant art will recognize that the various features described for the different embodiments can be suitably combined, un-combined, and re-combined with other features, alone, or in different combinations. Likewise, the various features described above should all be regarded as example embodiments, rather than limitations to the scope or spirit of the disclosure.

Persons of ordinary skill in the relevant arts will recognize that various embodiments can comprise fewer features than illustrated in any individual embodiment described above. The embodiments described herein are not meant to be an exhaustive presentation of the ways in which the various features may be combined. Accordingly, the embodiments are not mutually exclusive combinations of features; rather, the claims can comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

References to "embodiment(s)", "disclosure", "present disclosure", "embodiment(s) of the disclosure", "disclosed embodiment(s)", and the like contained herein refer to the specification (text, including the claims, and figures) of this patent application that are not admitted prior art.

For purposes of interpreting the claims, it is expressly intended that the provisions of 35 U.S.C. 112(f) are not to be invoked unless the specific terms "means for" or "step for" are recited in the respective claim.

What is claimed is:

1. A chemical mechanical planarization (CMP) conditioning segment, comprising: a substrate including a front surface and a plurality of elongated protrusions unitary therewith, each of said plurality of elongated protrusions defining an elongate axis substantially parallel with said front surface, each of said plurality of elongated protrusions including at least one ridge line extending in a direction of said elongate axis, said plurality of elongated protrusions protruding in a frontal direction that is normal to said front surface, the plurality of elongated protrusions grouped into a plurality of protrusion clusters on said conditioning segment, the elongate axes of the elongated protrusions extend radially outward from a central region of said clusters, wherein said elongate axis of each of said plurality of elongated protrusions defines one of at least two angles with respect to a sweeping direction of said substrate.

2. The CMP conditioning segment of claim 1, wherein said at least one ridge line is rounded.

3. The CMP conditioning segment of claim 1, wherein a ridge line of said at least one ridge line of at least some of said plurality of elongated protrusions is a superior ridge line to define a plurality of superior ridge lines.

4. The CMP conditioning segment of claim 1, wherein said at least one ridge line of at least some of said plurality of elongated protrusions includes two ridge lines that are coplanar.

5. The CMP conditioning segment of claim 1, wherein said substrate has a porosity in a range of 10% to 70% inclusive.

6. A method of fabricating the CMP conditioning segment of claim 5, comprising: providing said substrate; and forming said plurality of elongated protrusions in accordance with an outline of a prism-like geometry.

7. The method of claim 6, wherein said substrate provided in the step of providing comprises silicon carbide.

8. The method of claim 6, wherein said substrate provided in the step of providing comprises graphite, and forming said plurality of elongated protrusions comprises the machining said substrate, and the method further comprises converting said graphite to silicon carbide after the step of machining.

9. The method of claim 6, wherein said prism-like geometry is a triangular prism-like geometry.

10. The method of claim 6, wherein the step of forming comprises one of wire electrical discharge machining, masked abrasion machining, water jet machining, photo abrasion machining, and laser machining.

11. The method of claim 6, further comprising applying a coating to said elongated protrusions after the step of forming.

12. The method of claim 6, further comprising adhering superabrasive grit to said elongated protrusions after the step of forming.

13. A chemical mechanical planarization (CMP) pad conditioner, comprising: a substrate including a front surface and defining a plurality of elongated protrusions unitary therewith, said plurality of elongated protrusions protruding in a frontal direction that is substantially normal to said front surface, each of said plurality of elongated protrusions including at least one ridge line, said plurality of elongated protrusions arranged in columnar clusters presenting a variety of sweep angles; a dispersion of superabrasive grit particles disposed on said elongated protrusions; and a coating that covers said substrate, said elongated protrusions, and said dispersion of superabrasive grit particles.

14. The CMP pad conditioner of claim 13, wherein said coating is a diamond coating.

15. The CMP pad conditioner of claim 13, wherein said superabrasive grit particles are diamond particles.

16. A chemical mechanical planarization (CMP) pad conditioner, comprising a substrate including a front surface and defining a plurality of elongated protrusions unitary therewith protruding from a substrate floor of said front surface, each elongated protrusion of said plurality of elongated protrusions defining an elongate axis, said plurality of elongated protrusions protruding in a frontal direction that is substantially normal to said front surface and defining an average height measured from said substrate floor, said plurality of elongated protrusions defining a plurality of linear clusters that are in columns, each linear cluster comprises a plurality of said elongated protrusions that are in the same angular orientation, said column comprising a mix of linear clusters that have a variety of sweep angles.

17. The CMP pad conditioner of claim 16, further comprising a dispersion of superabrasive grit particles disposed on said substrate including the plurality of elongated protrusions.

18. The CMP pad conditioner of claim 16, wherein said substrate has a porosity of at least 10%.

* * * * *